US 9,619,316 B2

(12) United States Patent
Bains

(10) Patent No.: US 9,619,316 B2
(45) Date of Patent: Apr. 11, 2017

(54) TIMING OPTIMIZATION FOR MEMORY DEVICES EMPLOYING ERROR DETECTION CODED TRANSACTIONS

(75) Inventor: Kuljit Singh Bains, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 129 days.

(21) Appl. No.: 13/997,908

(22) PCT Filed: Mar. 26, 2012

(86) PCT No.: PCT/US2012/030525
§ 371 (c)(1),
(2), (4) Date: Oct. 20, 2014

(87) PCT Pub. No.: WO2013/147733
PCT Pub. Date: Oct. 3, 2013

(65) Prior Publication Data
US 2015/0058706 A1 Feb. 26, 2015

(51) Int. Cl.
*G06F 11/10* (2006.01)
*G11C 11/4096* (2006.01)
(Continued)

(52) U.S. Cl.
CPC .......... *G06F 11/1004* (2013.01); *G06F 3/061* (2013.01); *G06F 3/0653* (2013.01);
(Continued)

(58) Field of Classification Search
None
See application file for complete search history.

(56) References Cited

U.S. PATENT DOCUMENTS 7,644,344 B2 1/2010 Bains
7,773,435 B2 8/2010 Cho
(Continued)

FOREIGN PATENT DOCUMENTS

CN 1735869 A 2/2006
CN 101325090 A 12/2008
(Continued)

OTHER PUBLICATIONS

International Preliminary Report on Patentability and Written Opinion received for PCT Patent Application No. PCT/US2012/030525, mailed on Oct. 9, 2014, 6 pages.
(Continued)

*Primary Examiner* — Daniel McMahon
(74) *Attorney, Agent, or Firm* — Compass IP Law

(57) ABSTRACT

Systems, methods, and apparatuses are directed to optimizing turnaround timing of successive transactions between a host and a memory device. The host includes framing logic that generates a write frame that includes a plurality of data bits and an error bit checksum that is appended at the end of the data bits. The host further includes a bus infrastructure configured to accommodate the transfer of the write frame to the memory device and logic that defines the turnaround time to begin at a time instant that immediately follows the transfer of the data bits of the write frame. The turnaround time measures the time delay at which a succeeding write frame is to be transferred. In this manner, the turnaround time is optimized to enable the earlier initiation of successive data operations, thereby reducing the overall latency of successive back-to-back transactions.

18 Claims, 5 Drawing Sheets

(51) Int. Cl.

| | | |
|---|---|---|
| *G11C 29/42* | (2006.01) | |
| *G11C 7/10* | (2006.01) | |
| *G11C 7/22* | (2006.01) | |
| *G11C 11/4076* | (2006.01) | |
| *G11C 29/02* | (2006.01) | |
| *G06F 3/06* | (2006.01) | |

(52) U.S. Cl.
CPC .......... *G06F 3/0673* (2013.01); *G11C 7/1006* (2013.01); *G11C 7/222* (2013.01); *G11C 11/4076* (2013.01); *G11C 11/4096* (2013.01); *G11C 29/023* (2013.01); *G11C 29/028* (2013.01); *G11C 29/42* (2013.01)

(56) References Cited

U.S. PATENT DOCUMENTS

| | | |
|---|---|---|
| 7,969,813 B2 | 6/2011 | Bringivijayaraghavan et al. |
| 2003/0061459 A1 | 3/2003 | Aboulenein et al. |
| 2006/0164909 A1 | 7/2006 | Gower et al. |
| 2007/0088903 A1 | 4/2007 | Choi |
| 2008/0022187 A1* | 1/2008 | Bains .................. G06F 11/1004 714/763 |
| 2008/0080271 A1 | 4/2008 | Kim |
| 2008/0304330 A1* | 12/2008 | Bains .................. G11C 7/1006 365/189.02 |
| 2009/0132888 A1* | 5/2009 | Bains .................. G06F 11/1004 714/758 |
| 2010/0165780 A1 | 7/2010 | Bains et al. |
| 2010/0293343 A1 | 11/2010 | Perego |

FOREIGN PATENT DOCUMENTS

| | | |
|---|---|---|
| CN | 101364209A A | 2/2009 |
| CN | 101441896 A | 5/2009 |
| CN | 101609418 A | 12/2009 |
| CN | 101868788 A | 10/2010 |
| CN | 101978356 A | 2/2011 |
| TW | 1225260 | 12/2004 |
| WO | 2010005661 A2 | 1/2010 |
| WO | 2013/147733 A1 | 10/2013 |

OTHER PUBLICATIONS

International Search Report and Written Opinion received for PCT Patent Application No. PCT/US2012/030525, mailed on Nov. 26, 2012, 9 pages.
CN Search Report, Application No. 201280071929.2, Mailed Jul. 7, 2016, 3 pages.
English Translation of Taiwan Invention Patent Application No. 102110501 received Feb. 25, 2015, 2 pages.
English Translation of the Notice of Preliminary Rejection, Application No. 10-2014-7027307, Mailed Mar. 18, 2016, 3 pages.

* cited by examiner

TIMING OPTIMIZATION FOR MEMORY DEVICES EMPLOYING ERROR DETECTION CODED TRANSACTIONS

TECHNICAL FIELD

Embodiments of the present disclosure generally relate to the field of integrated circuits and, more particularly, to systems, methods and apparatuses for optimizing error bit checksum timing in the transfer of data in a common frame with a shared error bit code.

BACKGROUND

As electronic and computing devices evolve to provide more functionality and process more content, the rate at which information is transferred into associated memory systems continues to increase. In addition to these faster transfer rates, data integrity by way of error detection as well data security are also required.

However, conventional approaches to providing data integrity and error coverage may also affect memory processing efficiency and compromise overall system performance.

BRIEF DESCRIPTION OF THE DRAWINGS

Embodiments of the present disclosure are illustrated by way of example, and not by way of limitation, in the figures of the accompanying drawings in which like reference numerals refer to similar elements.

DETAILED DESCRIPTION

Embodiments of the present disclosure are generally directed to systems, methods, and apparatuses for optimizing turnaround timing of successive transactions between a host and a memory device. The host includes framing logic for generating a write frame that includes a plurality of data bits and an error bit checksum that is appended at the end of the data bits. The host further includes a bus infrastructure that accommodates the transfer of the write frame to the memory device and logic that defines the turnaround time to begin at a time instant that immediately follows the transfer of the data bits of the write frame. The turnaround time measures the time delay at which a succeeding write frame is to be transferred. In this manner, the turnaround time is optimized to enable the earlier initiation of successive data operations, thereby reducing the overall latency of successive back-to-back transactions.

Figure 1:
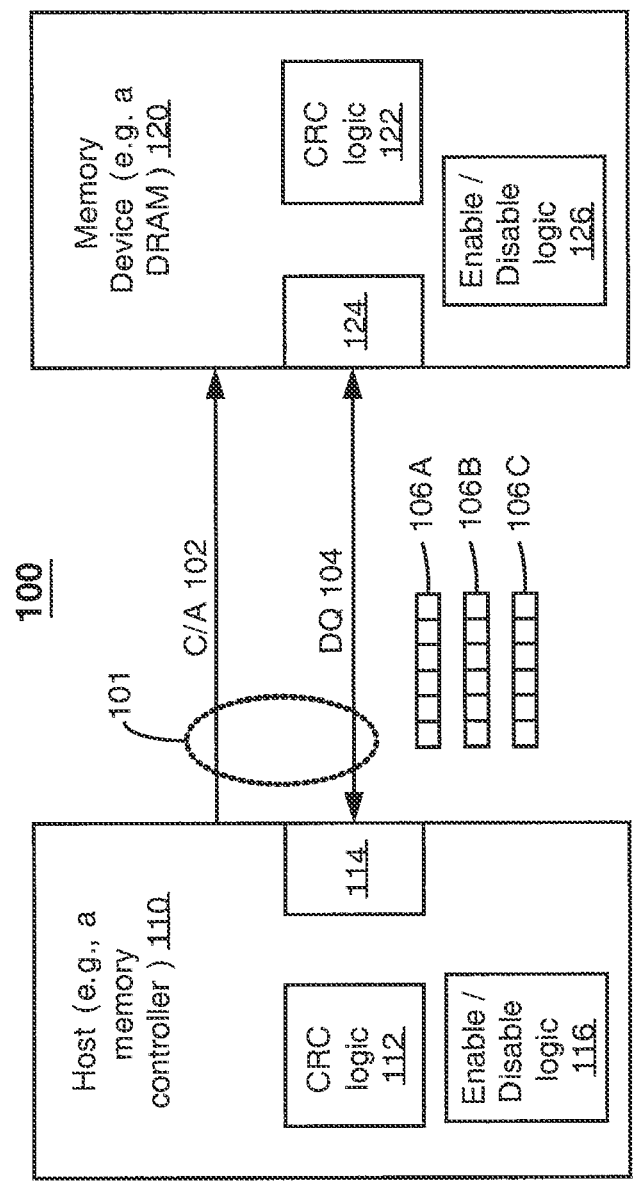
FIG. 1 depicts a high-level block diagram illustrating selected aspects of a computing system, in accordance with an embodiment of the present disclosure.

Turning to the figures, FIG. 1 is a high-level block diagram illustrating selected aspects of a computing system implemented, according to an embodiment of the present disclosure. System 100 may represent any of a number of electronic and/or computing devices that may include a memory device with a self-refresh mode. Such electronic and/or computing devices may include servers, desktops, laptops, mobile devices, smartphones, gaming devices, tablet computers, networking devices, etc. In the illustrated embodiment, system 100 includes host 110 (e.g., a memory controller) and memory device 120 (e.g., a DRAM). In alternative embodiments, system 100 may include more elements, fewer elements, and/or different elements. Moreover, although system 100 may be depicted as comprising separate elements, it will be appreciated that such elements may be integrated on to one platform.

Interconnect 10 links host 110 with memory device 120. In some embodiments, interconnect 101 is (at least partly) a point to point interconnect. In other embodiments, interconnect 101 is (at least partly) a multi-drop bus. In some embodiments, interconnect 101 complies, at least in part, with one or more of the standards and/or specifications that define the double data rate bus (e.g., DDR1, DDR2, DDR3, DDR4, and the like). In the illustrated embodiment, interconnect 101 includes command/address lanes 102 and data (or DQ) lanes 104. In other embodiments, interconnect 101 may include more elements, fewer elements, and/or different elements.

Command/Address (C/A) lanes 102 provide a plurality of lanes for sending commands and addresses to memory device 120. DQ lanes 104 provide a bi-directional read/write data bus. In alternative embodiments, DQ lanes 104 may be unidirectional. For ease of description, embodiments of the present disclosure are described with reference to a ×8 data width memory device. It is to be appreciated, however, that embodiments of the present disclosure may include other device data widths such as ×4, ×16, ×32, etc.

Host 110 controls the transfer of data to and from memory device 120. In some embodiments, host 110 is integrated onto the same die as one or more processors. In other embodiments, host 110 is part of a computing system's chipset. Host 110 may use a variety of commands to control the transfer of data. For example, the command encoding for a full write may be defined as "W." In some embodiments, host 110 supports a command for partial writes (e.g., Wm), in which at least some of the write data is masked using one or more data mask bits.

Host 110 includes, inter alia, error detection capabilities, such as, for example, error checksum (CRC) logic 112, framing logic 114, and enable/disable logic 116. CRC logic 112 enables host 110 to support an in-band CRC mechanism. For example, CRC logic 112 enables host 110 to generate a CRC checksum that is transferred in one or more data frames (e.g., over DQ lanes 104). In some embodiments, a CRC checksum may be generated for partial write frames. The CRC checksum may cover (at least some of) the data bits and (at least some of) the data mask bits in the write frame. In some embodiments, the data bits, data mask bits, and corresponding checksum are transferred in a common frame (e.g., over DQ lanes 104).

In some embodiments, the use of CRC to cover data frames can be selectively enabled or disabled. For example, in the illustrated embodiment, host 110 includes enable/disable logic 116 to selectively enable or disable the use of CRC. In some embodiments, enable/disable logic 116 may include one or more register bits (e.g., mode register set or MRS bits).

Host 110 may also include framing logic 114. Framing logic 114 includes logic to assemble the frames that are transferred to memory device 120. Similarly, logic 114 may also include logic to disassemble the frames that are received from memory device 120. In some embodiments, framing logic 114 is capable of assembling more than one type of data frame (e.g. data frames 106A, 106B, and 106C).

Memory device 120 provides (at least in part) the main system memory for system 100. In some embodiments, memory device 120 comprises a DRAM device (e.g., DDR1, DDR2, DDR3, DDR4, etc.). Memory device 120 includes error checksum (CRC) logic 122, framing logic 124, and enable disable logic 126. In some embodiments, CRC logic 122 enables memory device 120 to support an in-band CRC mechanism (e.g., on DQ lines 104). The term "in-band CRC mechanism" refers to supporting CRC (or other error bit scheme) without adding additional pins. CRC logic 122 may include CRC generation logic to generate a local checksum based on a received data frame. The local checksum may be compared with the checksum conveyed in the frame to determine whether there are any transmission errors. Memory device 120 may signal host 110 when transmission errors occur.

Framing logic 124 includes logic to assemble the frames that are transferred from host 110. Logic 124 may also include logic to disassemble the frames that are received from host 110. In some embodiments, framing logic 124 is capable of assembling more than one type of data frame (e.g. data frames 106).

As noted above, in some embodiments, the use of CRC to cover data frames can be selectively enabled or disabled. For example, in the illustrated embodiment, memory device 120 includes enable/disable logic 126 to selectively enable or disable the use of CRC. In some embodiments, enable/disable logic 126 may include one or more register bits (e.g., mode register set or MRS bits).

Figure 2:
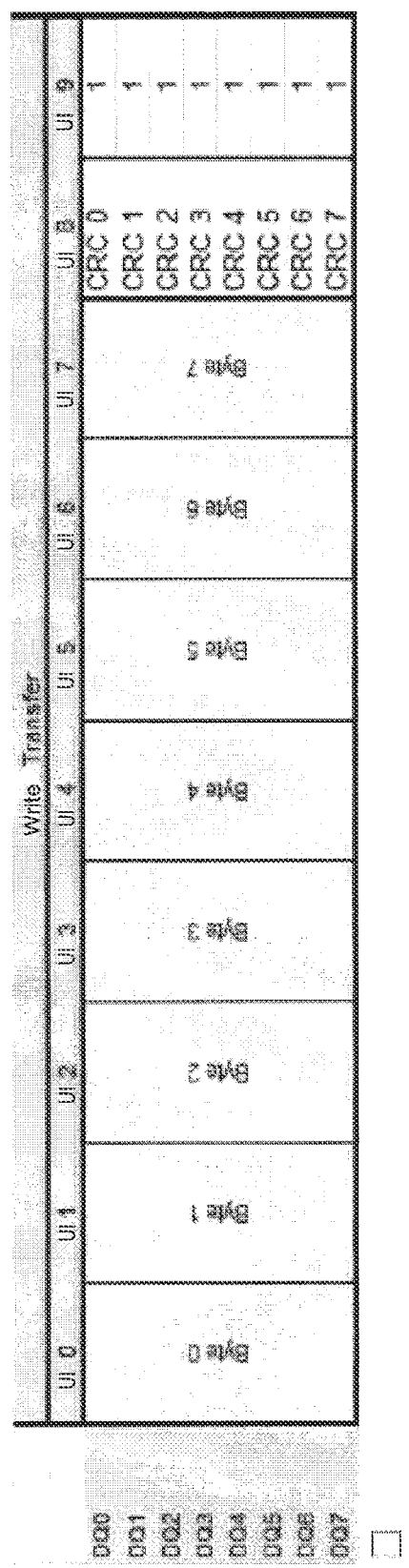
FIG. 2 depicts a write data frame format, in accordance with an embodiment of the present disclosure.

In many embodiments, CRC is enabled so that in-band CRC bytes are provided to ensure coverage for transmission errors. As such, FIG. 2 illustrates selected aspects of a ×8 write data frame 200 with CRC bytes, according to an embodiment of the present disclosure. In particular, write data frame 200 represents a frame of data being written to memory. Write data frame 200 comprises a ten unit interval (UI) format in which in-band CRC checksum bytes are appended at the end of the frame. In the illustrated embodiment, the first eight UIs convey write data bytes (e.g., UI 0 through UI 7) while UI 8 conveys the CRC byte and UI 9 is not used, thereby comprising all 1s. In some embodiments, the first eight UIs (e.g., UI 0 through UI 7) convey write data bytes, UI 8 conveys the CRC byte, and UI 9 conveys a data mask byte. In any case, the write data frame 200 to be transferred comprises 10 UIs.

In some implementations, of the 10 UIs comprising the write data frame 200, only the first eight UIs (e.g., UI 0-UI 7), which represent the write data, are processed to access, copy, and/or store data to/from the DRAM memory device core. In other words, the last 2 UIs (e.g., UI 8 and UI 9) of write data frame 200, representing the CRC checksum bytes, are not transferred to the DRAM core. This is because the checksum process, in which the 2 CRC UIs of write data frame 200 are compared with local CRC checksum data to determine any transmission errors, is executed in parallel and does not require access or transfers to the DRAM core.

However, even though the last 2 CRC UIs are not used by the DRAM memory device, the transactional timing cycles, namely the time taken to process write operations as well as account for turnaround delays and settling time latencies, may be based on the entire 10 UI write data frame 200. For example, in processing multiple, back-to-back write-to-read and/or write-to-write transactions for CRC-enable situations, the timing used to initiate back-to-back successive transactions may be based on the 10 UI write data frame, although the last two UI comprising CRC checksum bytes are not used by the DRAM device.

Figure 3:
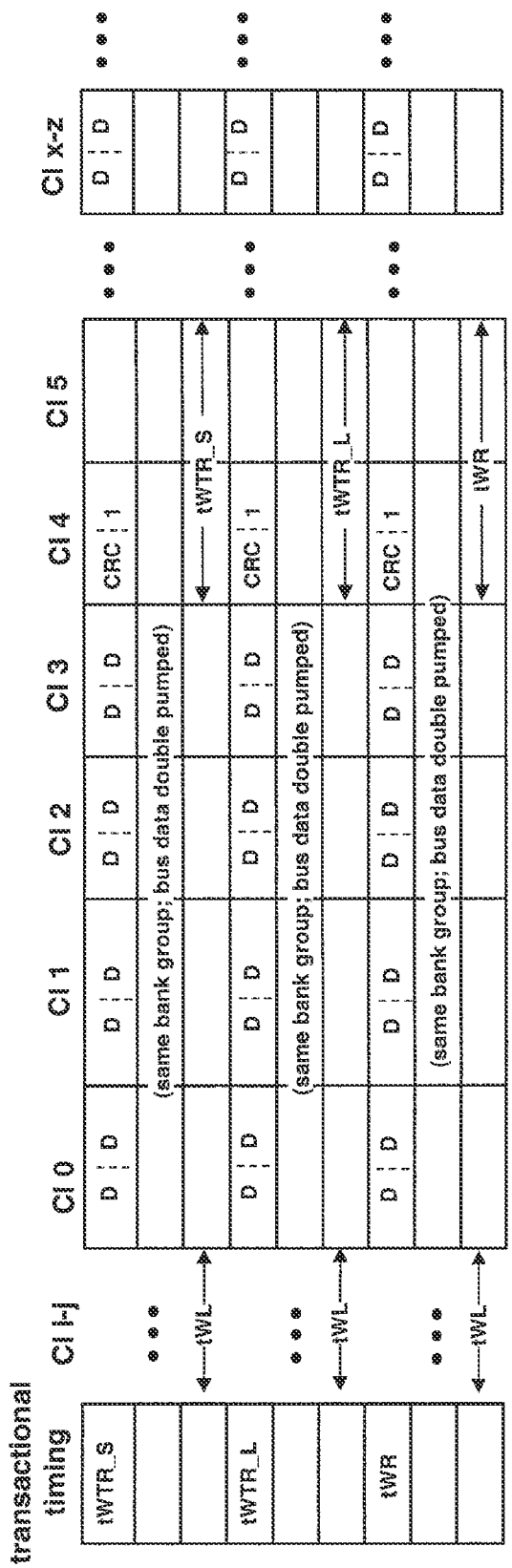
FIG. 3 depicts a high-level transactional cycle scheme for optimizing turnaround timing for successive transactions, in accordance with an embodiment of the present disclosure.

It should be appreciated that transaction timing based on UIs unused by the DRAM memory device may reduce processing efficiency as well as impact overall system performance. To this end, FIG. 3 depicts transactional cycle scheme 300, in accordance with various embodiments of the present disclosure. Transactional scheme 300 represents a more uniform and efficient transactional timing cycle regardless of whether CRC is enabled, by defining the turnaround timing for successive transactions to begin immediately after the write data is processed without taking into account the time taken to process the CRC bytes.

In particular, transactional scheme 300 identifies clock cycles (e.g., CI 0-CI 5) which indicate the time taken to execute various transactions, in accordance with various embodiments of the present disclosure. For example, FIG. 3 depicts the transaction timing for: (a) write-to-read transaction between different DRAM bank groups (tWTR_S); (b) write-to-read transaction for the same DRAM bank groups (tWTR_L); and (c) write recovery (tWR). Consistent with the non-limiting embodiments disclosed above, for purposes of understanding, transactional scheme 300 employs a ×8 write data frame 200 with CRC bytes, comprising a 10 UI format, of which 8 UIs convey write data and the last 2 UIs convey CRC bytes or one CRC byte and one dummy byte (i.e., all "1"s). Moreover, transactional cycle scheme 300 reflects a double data rate (DDR) bus interface, in which operations are executed for both, the rising and falling edges of each clock cycle CI (i.e., double pumped bus), so that two UIs are processed during each clock cycle CI.

As shown in FIG. 3, execution of any of the noted transactions includes a common initial write latency period (tWL) which may span one or more dock cycles (e.g., CI i-j). The tWL generally reflects time lapse before the host 110 (e.g., memory controller) provides the write data.

After the initial tWL period, for the transaction comprising write-to-read operations between different DRAM bank groups (WTR_S), the 8 UI write data is processed over four clock cycles (e.g., CI 0-CI 3) while the 2 UI CRC (which includes the dummy bytes) are processed in clock cycle CI 4. However, instead of specifying the turnaround time tWTR_S for a subsequent write-to-read operation (between different DRAM bank groups) to commence at the beginning of clock cycle CI 5 (i.e., after the 2 UI CRC is processed in CI 4), the turnaround time is defined to commence at the beginning of CI 4 (i.e., after the 8 UI write data has been processed).

Along similar lines, for write-to-read operations of the same DRAM bank group (WTR_L), the 8 UI write data is shown to be processed over four clock cycles (e.g., CI 0-CI 3) while the 2 UI CRC is shown to be processed in clock cycle CI 4. Again, the turnaround time tWTR_L for a subsequent write-to-read operation (for the same DRAM bank group) commences at the beginning CI 4 as opposed to the beginning of CI 5. The same is true for write recovery timing (tWR), as depicted in FIG. 3.

In so doing, transactional cycle scheme 300 exploits the lack of DRAM core involvement during the processing of the 2 UI CRC by advancing the turnaround timing one clock cycle ahead. This enables host 110 (e.g., memory controller) to initiate the next successive transaction one clock cycle ahead. As such, transactional cycle scheme 300 provides for optimized turnaround time periods and the earlier initiation of successive data operations, thereby reducing the overall latency of back-to-back transactions such as sequential write, read, and write recovery operations.

Figure 4:
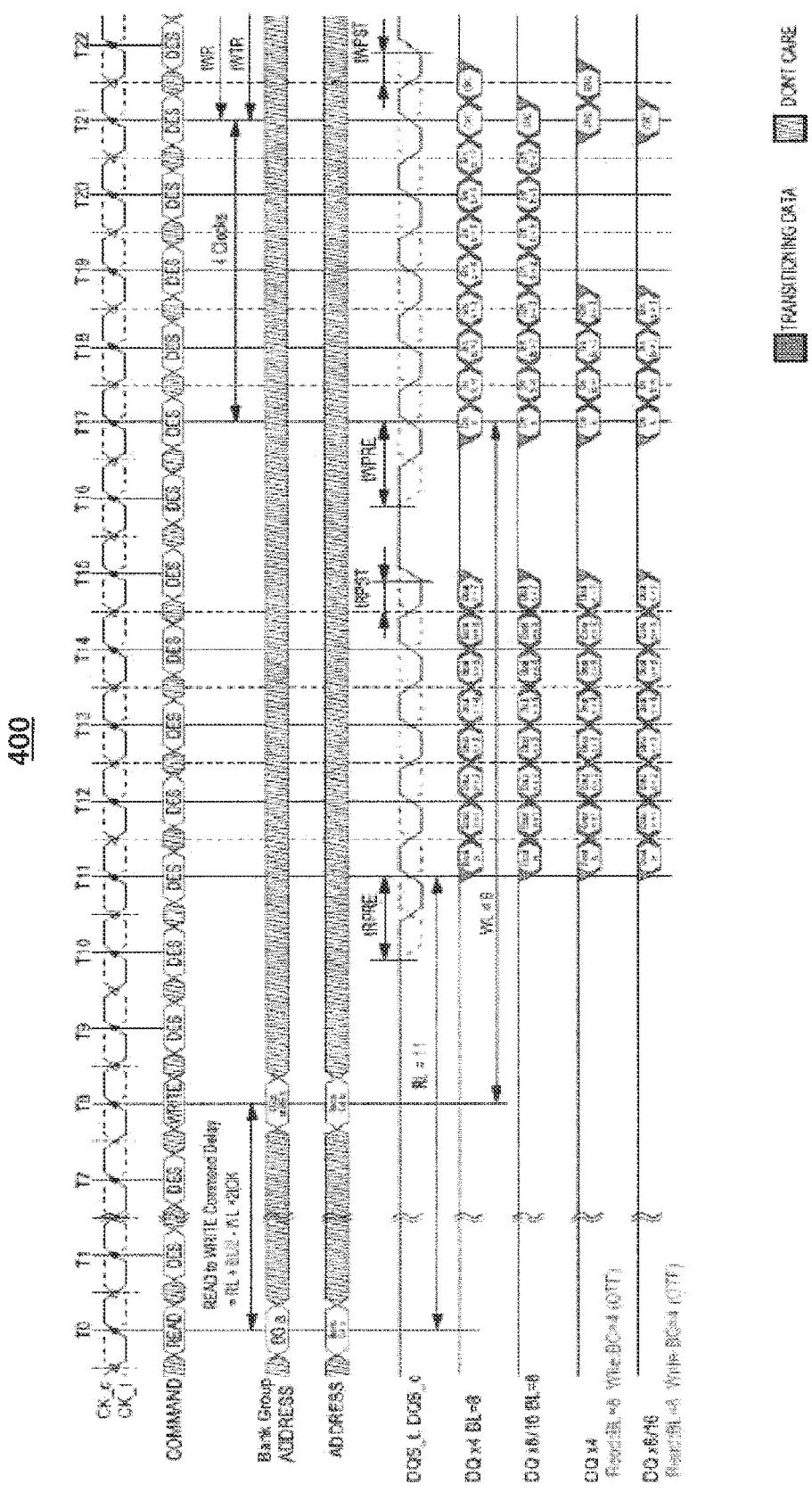
FIG. 4 depicts a timing diagram illustrating an optimized turnaround timing for successive transactions, in accordance with an embodiment of the present disclosure.

FIG. 4 illustrates timing diagram 400, in accordance with the various embodiments of the present disclosure. Consistent with transactional cycle scheme 300 described above, timing diagram 400 provides a more detailed representation of the operations for a ×8 write data frame 200 with 8 UIs conveying data and the last 2 UIs conveying CRC bytes (or one CRC byte and one dummy byte). It will be appreciated that timing diagram 400 may apply to other formats, such as, for example, a ×4 write data frame.

In particular, timing diagram 400 indicates that a write command is issued at time instant T8. After a write latency tWL of nine dock intervals, the write data is supplied by host 110 (e.g., memory controller) at instant T17. As depicted in FIG. 4, the processing for the 10 UI frame span 5 clock cycles, that is, from T17 to T22. However, turnaround time for the write-to-read tWTR and write recovery tWR begins at the end of 4 dock cycles at instant T21. This illustrates that the turnaround times for tWTR and tWR are defined to commence after the 8 UIs of data are processed as opposed to waiting until after the full 10 UI data frame 200 is processed. As such, host 110 (e.g., memory controller) is capable of triggering or initiating the subsequent back-to-back transaction one dock cycle ahead.

Figure 5:
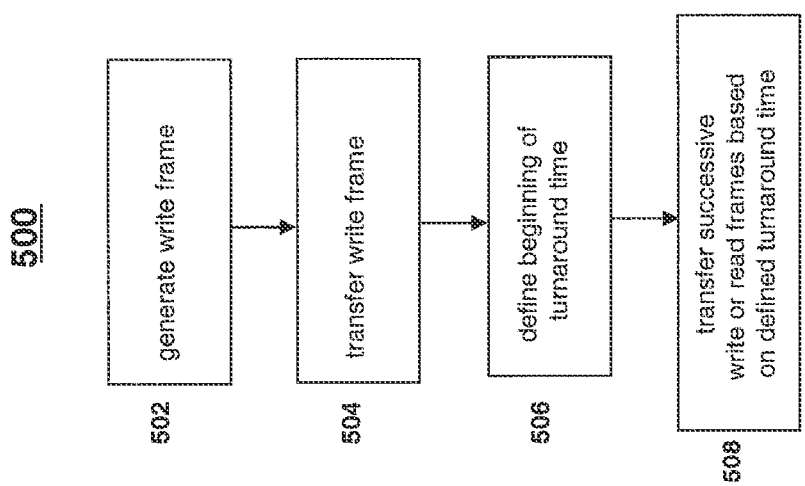
FIG. 5 depicts a functional flow diagram of a process for optimizing turnaround timing for successive transactions, in accordance with an embodiment of the present disclosure.

To this end, FIG. 5 illustrates process 500, is a flow diagram illustrating selected aspects of a method for optimizing turnaround timing, in accordance with various embodiments of the present disclosure. At block 502, process 500 provides for the generation of a write frame. As noted above, host 110 (e.g., a memory controller) includes logic to provide commands and corresponding address information as well as data to memory device 120. Host 110 also includes error checksum (CRC) logic 112 to generate an error bit checksum (e.g., a CRC checksum) and framing logic 114 to assemble the data bits and error bit checksum into a frame that is to be transferred to memory device 120.

At block 504, the data frame is transferred to memory device 120 via a data bus. After the transfer, at block 506, the beginning of the turnaround time is defined to begin at the time instant immediately after the data bits have been transferred. That is, the turnaround time is advanced earlier by an interval of time corresponding to the time taken to transfer the CRC checksum (e.g., one or two clock cycles).

At block 508, host 110 employs the defined earlier turnaround time to trigger the transfer of successive, back-to-back write frames. As such, process 500 provides for optimized turnaround time periods and the earlier initiation of successive data operations, thereby reducing the overall latency of back-to-back transactions such as sequential write, read, and write recovery operations.

It will be appreciated that elements of embodiments of the present disclosure may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the present disclosure may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the description above, certain terminology is used to describe embodiments of the present disclosure. For example, the term "logic" is representative of hardware, firmware, software (or any combination thereof) to perform one or more functions. For instance, examples of "hardware" include, but are not limited to, an integrated circuit, a finite state machine, or even combinatorial logic. The integrated circuit may take the form of a processor such as a microprocessor, an application specific integrated circuit, a digital signal processor, a micro-controller, or the like.

It should be appreciated that reference throughout this specification to "one embodiment" or "an embodiment" means that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. A system to reduce back-to-back data transaction latency, comprising:
    a memory controller including
        cyclic redundancy check (CRC) logic to generate a CRC checksum,
        framing logic to form a ten unit interval (UI) data frame to have 64 bits of data in the first eight unit intervals and an 8 bit CRC checksum in the ninth unit interval, wherein a clock cycle includes two UIs,
        controller transaction logic to transfer the ten UI data frame to a synchronous dynamic random access memory (SDRAM) device; and
    the SDRAM device having
        a DRAM core having multiple memory addresses,
        DRAM transaction logic to commence a turnaround time in response to a start of a fifth clock cycle after a write latency.

2. The system of claim 1, wherein the turnaround time is defined by a tWTR_S parameter.

3. The system of claim 1, wherein the turnaround time is defined by a tWTR_L parameter.

4. The system of claim 1, wherein the turnaround time is defined by a tWR parameter.

5. The system of claim 1, wherein the SDRAM device includes a DDR4 SDRAM device.

6. The system of claim 1, wherein the SDRAM device includes a LPDDR4 SDRAM device.

7. A synchronous dynamic random access memory (SDRAM) device, the SDRAM device comprising:

a DRAM core having multiple memory addresses;

framing logic to receive a ten unit interval (UI) data frame having 64 bits of data in the first eight unit intervals and an 8 bit CRC checksum in the ninth unit interval from a memory controller, wherein a clock cycle includes two UIs; and transaction logic to commence a turnaround time in response to a start of a fifth clock cycle after a write latency.

8. The SDRAM device of claim 7, wherein the turnaround time is defined by a tWTR_S parameter.

9. The SDRAM device of claim 7, wherein the turnaround time is defined by a tWTR_L parameter.

10. The SDRAM device of claim 7, wherein the turnaround time is defined by a tWR parameter.

11. The SDRAM device of claim 7, wherein the SDRAM device includes a DDR4 SDRAM device.

12. The SDRAM device of claim 7, wherein the SDRAM device includes a LPDDR4 SDRAM device.

13. A memory controller to reduce back-to-back data transaction latency, comprising:

cyclic redundancy check (CRC) logic to generate a CRC checksum, framing logic to form a ten unit interval (UI) data frame to have 64 bits of data in the first eight unit intervals and an 8 bit CRC checksum in the ninth unit interval, transaction logic to transfer the ten UI data frame to a synchronous dynamic random access memory (SDRAM) device, wherein a turnaround time corresponding to the ten UI data frame is initiated before the entire ten UI data frame is transferred.

14. The memory controller of claim 13, wherein the turnaround time is defined by a tWTR_S parameter.

15. The memory controller of claim 13, wherein the turnaround time is defined by a tWTR_L parameter.

16. The memory controller of claim 13, wherein the turnaround time is defined by a tWR parameter.

17. The memory controller of claim 13, wherein the SDRAM device includes a DDR4 SDRAM device.

18. The memory controller of claim 13, wherein the SDRAM device includes a LPDDR4 SDRAM device.

* * * * *